(12) United States Patent
Fechner

(10) Patent No.: US 8,742,831 B2
(45) Date of Patent: Jun. 3, 2014

(54) METHOD FOR DIGITAL PROGRAMMABLE OPTIMIZATION OF MIXED-SIGNAL CIRCUITS

(75) Inventor: Paul S. Fechner, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 883 days.

(21) Appl. No.: 12/390,792

(22) Filed: Feb. 23, 2009

(65) Prior Publication Data

US 2010/0214009 A1 Aug. 26, 2010

(51) Int. Cl.
*H03K 3/01* (2006.01)
*G05F 1/46* (2006.01)

(52) U.S. Cl.
CPC .................................. *G05F 1/46* (2013.01)
USPC .......................................................... 327/534

(58) Field of Classification Search
CPC ........... G11C 5/145; G11C 5/147; G05F 1/46
USPC ......... 327/427, 429, 564–566, 530, 534–538, 327/540, 541, 543
See application file for complete search history.

(56) References Cited

U.S. PATENT DOCUMENTS

| | | | |
|---|---|---|---|
| 5,602,790 A | 2/1997 | Mullarkey | |
| 6,166,584 A | 12/2000 | De | |
| 6,239,649 B1 | 5/2001 | Bertin et al. | |
| 6,373,281 B1 | 4/2002 | Chuang et al. | |
| 6,411,156 B1 | 6/2002 | Borkar et al. | |
| 6,774,706 B2 * | 8/2004 | Miyazaki et al. | 327/534 |
| 6,936,898 B2 | 8/2005 | Pelham et al. | |
| 7,164,307 B2 | 1/2007 | Tschanz et al. | |
| 7,242,231 B2 * | 7/2007 | Kuo et al. | 327/156 |
| 7,330,049 B2 | 2/2008 | Perisetty | |
| 7,332,763 B1 | 2/2008 | Burr et al. | |
| 7,355,437 B2 | 4/2008 | Perisetty | |
| 7,388,399 B1 | 6/2008 | Kursun et al. | |
| 7,400,186 B2 | 7/2008 | Tschanz et al. | |
| 7,816,936 B2 * | 10/2010 | Ito | 324/750.3 |
| 2006/0132187 A1 | 6/2006 | Tschanz et al. | |
| 2007/0139098 A1 * | 6/2007 | Klass et al. | 327/534 |
| 2007/0200596 A1 | 8/2007 | Lee et al. | |
| 2008/0258802 A1 | 10/2008 | Perisetty | |
| 2008/0277731 A1 | 11/2008 | Edwards et al. | |
| 2008/0315950 A1 | 12/2008 | Koh et al. | |

OTHER PUBLICATIONS

Rabaey, Jan, "Issues in Low Power Design-Managing Leakage", Aug. 28, 2006, Publisher: University of California: Department of Electrical Engineering and Computer Sciences , Published in: Berkeley, CA.

(Continued)

*Primary Examiner* — Sibin Chen
(74) *Attorney, Agent, or Firm* — Shumaker & Sieffert, P.A.

(57) ABSTRACT

A method for digital programmable optimization of a mixed-signal circuit is provided. The method comprises dividing up one or more transistor devices of the mixed-signal circuit into one or more transistor segments, with each transistor segment including a body tie bias terminal. Each body tie bias terminal is coupled to at least one voltage bias, either by placing each body tie bias terminal in signal communication with one or more bias nodes in the mixed-signal circuit, or by placing each body tie bias terminal in signal communication with a non-precision bias voltage source. Each body tie terminal is also arranged to be in signal communication with a separate one of one or more digital programmable storage elements.

20 Claims, 5 Drawing Sheets

(56) References Cited

OTHER PUBLICATIONS

Teodorescu, Radu et al, "Mitigating Parameter Variation with Dynamic Fine-Grain Body Biasing", "40th Annual IEEE/ACM International Symposium on Microarchitecture", Dec. 1-5, 2007, pp. 27-42, Publisher: MICRO 2007.

Tschanz, James W. et al., "Adaptive Body Bias for Reducing Impacts of Die-to-Die and Within-Die Parameter Variations on Microprocessor Frequency", "IEEE Journal of Solid-State Circuits", Nov. 2002, pp. 1396-1402, vol. 37, No. 11, Publisher: IEEE.

Li, Xin et al., "Adaptive Post-Silicon Tuning for Analog Circuits: Concept, Analysis and Optimization", "IEEE/ACM International Conference on Computer Aided Design (ICCAD)", 2007, pp. 450-457, Publisher: IEEE.

Kim et al., "Effectiveness of Using Supply Voltage as Back-Gate Bias in Ground Plane SOI MOSFET's", 2004 IEEE International SOI Conference, Oct. 2004, 2 pages.

European Search Report from corresponding EP Application No. 10152695, mailed Jun. 16, 2010, 3 pages.

European Examination Report from corresponding EP Application No. 10152695, mailed Jun. 18, 2010, 5 pages.

Reply to communication from the Examining Division, for EP Application No. 10152695.2, dated Oct. 11, 2010, 15 pages.

\* cited by examiner

METHOD FOR DIGITAL PROGRAMMABLE OPTIMIZATION OF MIXED-SIGNAL CIRCUITS

BACKGROUND

Mixed-signal circuits are sensitive to transistor mismatch. The well known Pelgrom model has demonstrated that the variation between two devices on the same die due to random mismatch is inversely proportional to the square root of the device area. Since transistor mismatch effects grow worse with shrinking transistor sizes, mismatch effects have become a dominant yield and performance limiting factor in high speed mixed-signal circuit designs. Such mismatch effects makes it increasingly difficult for analog and radio frequency (RF) circuits to benefit from the transistor scaling available at each new process technology node. While some approaches have been developed to counter mismatch effects, they all suffer from various limitations.

For example, adaptive body bias (ABB) techniques have been applied to digital circuit operation to provide post processing adjustment for die-to-die and within die variation. However, most of the development effort has been directed to the implementation and adjustment of one or more complex analog body bias generators to create precision analog voltages to perform the body bias adjustments needed. It is presumed that similar techniques could be applied to mixed-signal circuits at the expense of adding multiple area consuming analog body bias generators, which must be routed to each critical sub-circuit node body terminal.

Alternatively, for analog circuits, a technique has been proposed involving the physical implantation of multiple differential pairs connected in parallel and selecting the subset which achieves the desired level of matching. This approach has major limitations in excess silicon area and added gate capacitance.

SUMMARY

The present invention relates to a method for digital programmable optimization of mixed-signal circuits. The method comprises dividing up one or more transistor devices of the mixed-signal circuit into one or more transistor segments, with each transistor segment including a body tie bias terminal. Each body tie bias terminal is coupled to at least one voltage bias, either by placing each body tie bias terminal in signal communication with one or more bias nodes in the mixed-signal circuit, or by placing each body tie bias terminal in signal communication with a non-precision bias voltage source. Each body tie terminal is also arranged to be in signal communication with a separate one of one or more digital programmable storage elements.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

Figure 1:
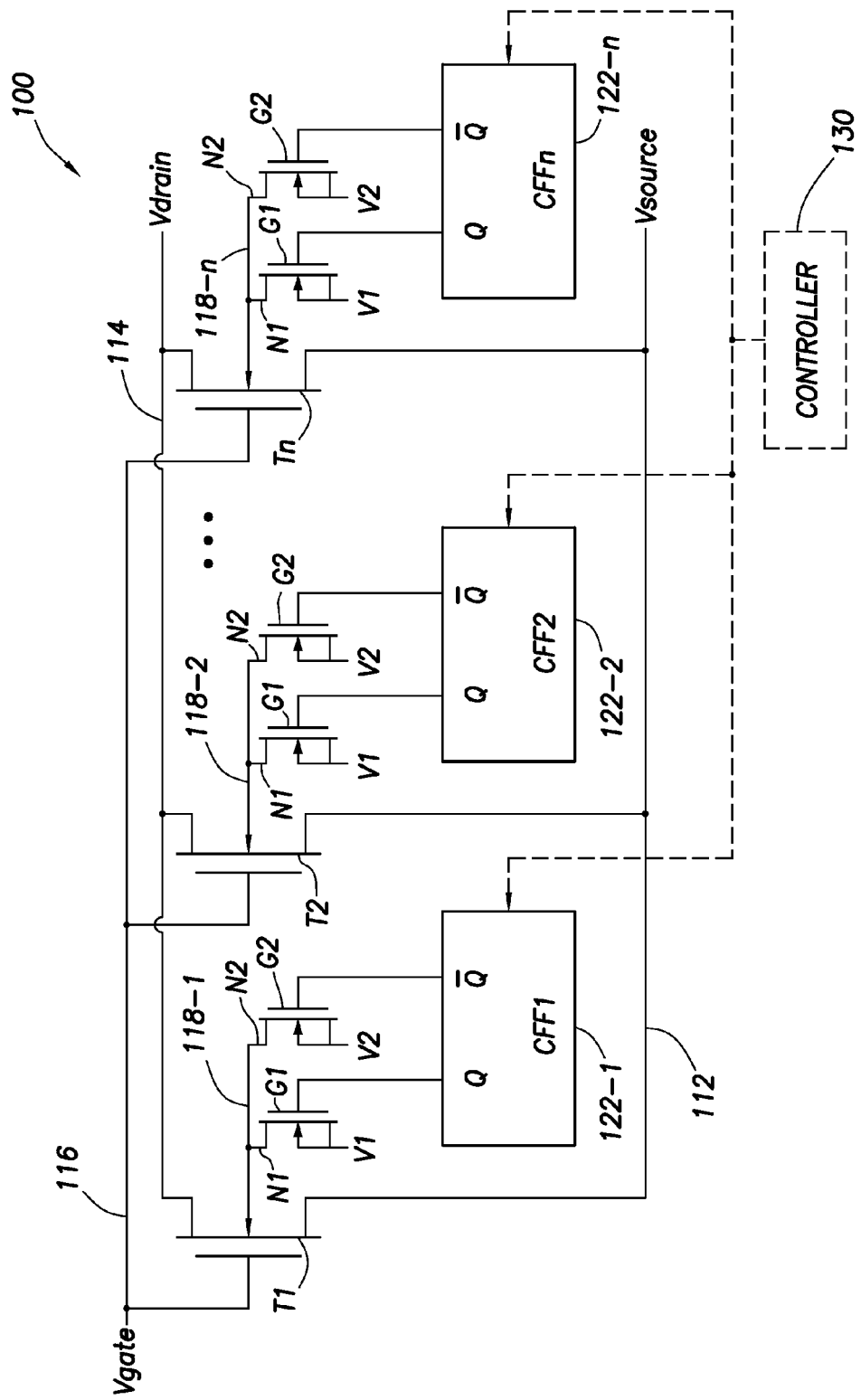
FIG. 1 is a circuit diagram for a digitally controlled mixed-signal transistor device according to one embodiment of the invention.

In the following detailed description, embodiments are described in sufficient detail to enable those skilled in the art to practice the invention. It is to be understood that other embodiments may be utilized without departing from the scope of the present invention. The following detailed description is, therefore, not to be taken in a limiting sense.

The present invention relates to a system and method for digital programmable optimization of mixed-signal circuits, which improves yield, improves performance, and reduces power consumption. The present technique generally includes dividing up individual transistors into smaller segments, and individually connecting each segment's body to bias nodes that are already available or to a simple non-precision bias voltage. This enables the adjustment of a composite transistor characteristic to the required degree of precision, and eliminates the need for multiple precision bias generators for each critical node. By making the transistor characteristics at critical circuit nodes adjustable post processing, the matching required for optimal circuit operation is produced.

The present approach addresses an industry wide scaling limitation associated with transistor and process induced transistor mismatch, which produces mixed-signal yield and performance limitations. These grow worse at each new complementary metal-oxide-semiconductor (CMOS) technology node. The present technique improves transistor density and provides a viable solution to the scaling limits due to mismatch. For example, the method of the invention enables 150 nm, 90 nm, and more advanced technologies to correct for process and transistor mismatch characteristics after processing.

The present approach can be used not only for mixed-signal circuitry, but also in digital circuitry. Such circuitry can be radiation hardened according to known techniques. The present approach is very useful in achieving yield maximization, and the creation of self-healing circuits for both analog and digital applications. The present technique enables the gate area of the critical node transistors to be reduced, improving both speed and power required for circuit operation.

In the present circuit design technique, bias voltages that are normally available in mixed-signal circuits are used to provide alternative voltages that a transistor body terminal can be connected to via simple transistor switches. This allows individual transistors to be connected to different biases in order to adjust for both process die-to-die variation and individual device mismatch. In order to achieve the desired matching resolution for optimal circuit function, the transistors are divided into n segments each with its own individual body bias terminal, which can be switched to the bias node needed to adjust the average transistor characteristic to be within the design window.

The physical interface between digital circuit control logic and the mixed-signal circuitry can be accomplished through a body tie terminal. Standard silicon-on-insulator (SOI) circuit design techniques ignore the body tie terminal, connecting it to either a source or power supply. Further, in most commercially available SOI CMOS processes, connecting the body involves a significant overhead penalty in increased gate capacitance. These issues are addressed through implementation of the present approach on SOI CMOS processes designed to efficiently implement individual body tie connections without adding significant gate capacitance. The efficiency of this SOI process in creating the individual body tie connections minimizes the area impact without introducing additional process steps, such as the triple wells required to attempt a similar configuration in bulk CMOS.

The switches in the circuits can be controlled with digital programmable storage elements such as digital flip-flops, which can provide an interface to a digital real time performance optimization control system in some embodiments. The present technique can be applied to digital circuits if a simple non-precision bias generator is added locally to the sub-circuit of interest. A non-precision bias generator can also be added to analog circuits if needed.

The present method can be used to enable the maximum SerDes (Serializer/Deserializer) frequency to increase from 3.125 GHz to the next higher operational frequency node of 4.25 GHz and possibly 6 GHz.

Further details of the system and method of the invention are set forth hereafter and with reference to the drawings.

Transistor Body Ties

While the present approach can be implemented in triple well bulk processes, and non-body tied SOI technologies, it is most advantageous in an area-efficient body tied SOI technology. A unique characteristic of the SOI technology used in implementing the present technique is an area efficient integration of connections to the body of the transistors, referred to as "body ties." The body ties eliminate hysteresis and other floating body effects that make mixed-signal designs very difficult. The body tie connections do not add gate capacitance, thus maximizing frequency response for high speed mixed-signal circuit design.

The availability of the body tie terminal provides an additional input to the performance characteristic of each individual transistor, which is utilized to enable adjustment of critical performance nodes to increase performance design margin by compensating for normal process variation and transistor mismatch. Also, the availability of the body tie terminal in SOI processes provides a practical way of healing both yield and performance for mixed-signal circuits when incorporated into a healing system architecture.

Mixed-Signal Circuit Embodiments

FIG. 1 is a circuit diagram for an n-state digitally controlled mixed-signal transistor device 100 according to one embodiment of the invention. The transistor device 100 is divided into a plurality of transistor segments T1, T2, . . . Tn of various widths, with each transistor segment having individually controlled body bias. The number of transistor segments is determined by the specifics of the application using a cost/benefit analysis between area and the precision of the control needed.

The source region of each transistor segment is coupled to a voltage source (Vsource) bus 112, and the drain regions are coupled to a voltage drain (Vdrain) bus 114. The gates of the transistor segments are coupled to a voltage gate (Vgate) bus 116. The actual threshold voltage is the weighted average of the threshold of each of the transistor segments.

Each of the transistor segments T1 to Tn has an independent body tie bias terminal 118-1 to 118-n that is connected to voltages V1 or V2 through a pair of minimum size interface transistors N1 and N2. The interface transistors N1, N2 are in turn coupled to respective n-control flip-flops (CFF) 122-1 to 122-n at gates G1 and G2 of transistors N1, N2. This enables the net characteristic of transistor device 100 to depend upon the state of the CFFs. The voltages V1 and V2 may be any bias available in a mixed-signal circuit including the Vsource. The transistor widths of segments T1 to Tn are selected to permit the degree of adjustment needed to modify the transistor device's effective threshold and current within a prescribed window. The resulting transistor average threshold voltage can be controlled to $2^n$ values depending upon V1, V2 and the state of the n flip-flops.

Depending upon the specifics of the application, a circuit designer may use the present approach to adjust for process and temperature variation as well as mismatch. For many applications one flip-flop may be enough, with the designer having the option to control all or only a portion of the transistor width.

Figure 2:
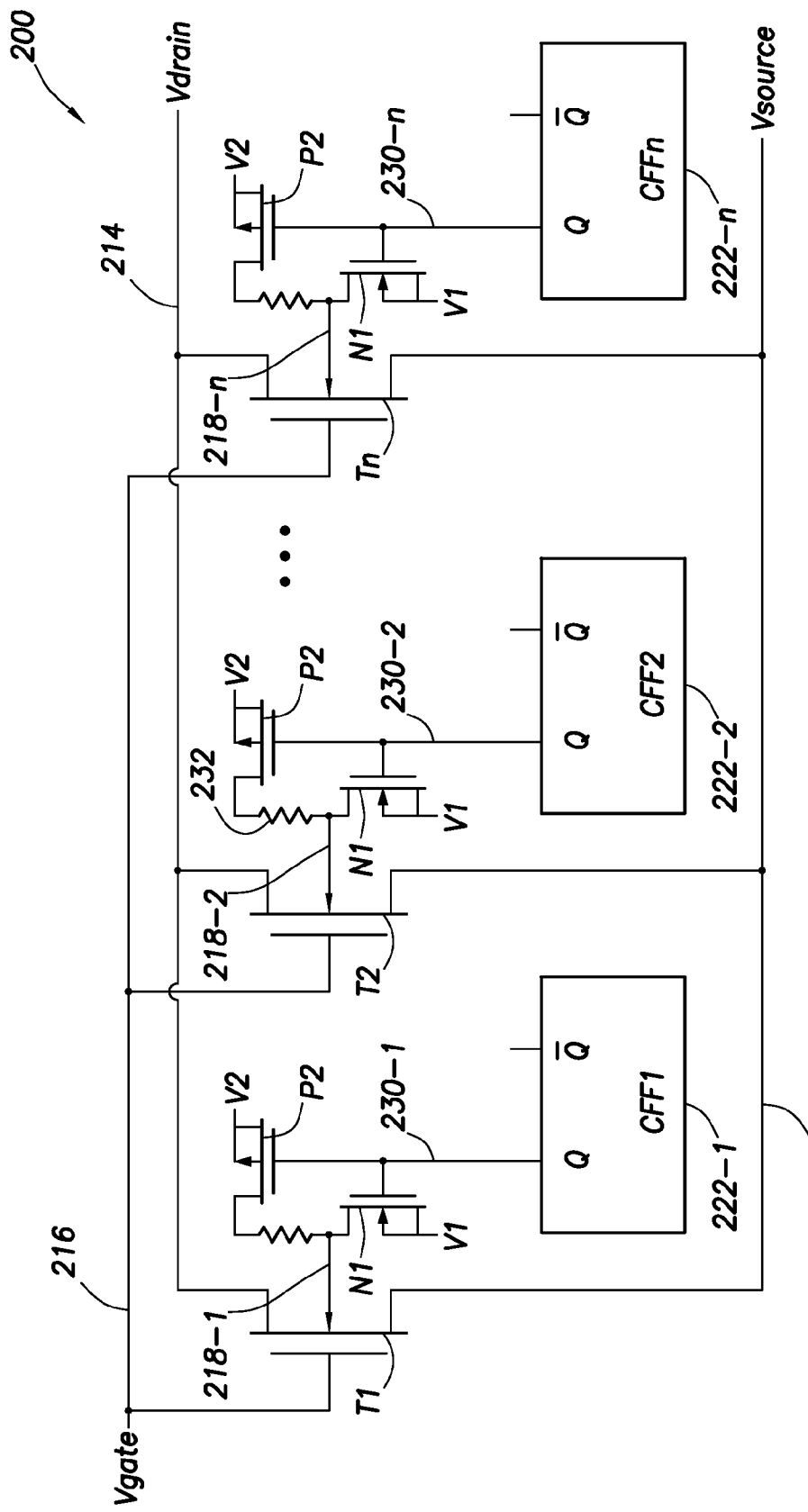
FIG. 2 is a circuit diagram for a digitally controlled mixed-signal transistor device according to another embodiment of the invention.

FIG. 2 is a circuit diagram for an n-state digitally controlled mixed-signal transistor device 200 according to another embodiment of the invention. The transistor device 200 is divided into transistor segments T1 to Tn, with each segment having individually controlled body bias. The source region of each transistor segment is coupled to a Vsource bus 212, and the drain regions are coupled to a Vdrain bus 214. The gates of the transistor segments are coupled to a Vgate bus 216.

Each of the transistor segments has an independent body tie bias terminal 218-1 to 218-n that is connected to a voltage V1 through a minimum size interface transistor N1, and to a voltage V2 through a minimum size interface transistor P2. Each of the interface transistors N1 and P2 for each transistor segment is coupled to respective n-control flip-flops 222-1 to 222-n using a single control line 230-1 to 230-n.

The configuration of transistor device 200 is useful when voltage V2 is greater than Vsource. This allows one control line to be wired from the control flip-flops to both interface transistors N1 and P2. In one embodiment, a current limiting resistor 232 can be interposed between transistor P2 and body tie bias terminal 218 when V2 is more than about 0.6 V larger than Vsource. The voltage V2 can be generated locally with one or more diodes (not shown) connected to a positive supply voltage (Vdd). For example, when Vdd=1.8 V, three diodes in series will generate about 1.8/4=0.45 V body bias. The same diodes can be used to generate V2 for multiple segments simultaneously.

The interface transistors N1, N2, and P2 in FIGS. 1 and 2 are shown with their body connected to the source terminal. For many applications this configuration is not necessary and may be left floating, reducing the layout area required for physical implementation.

Figure 3:
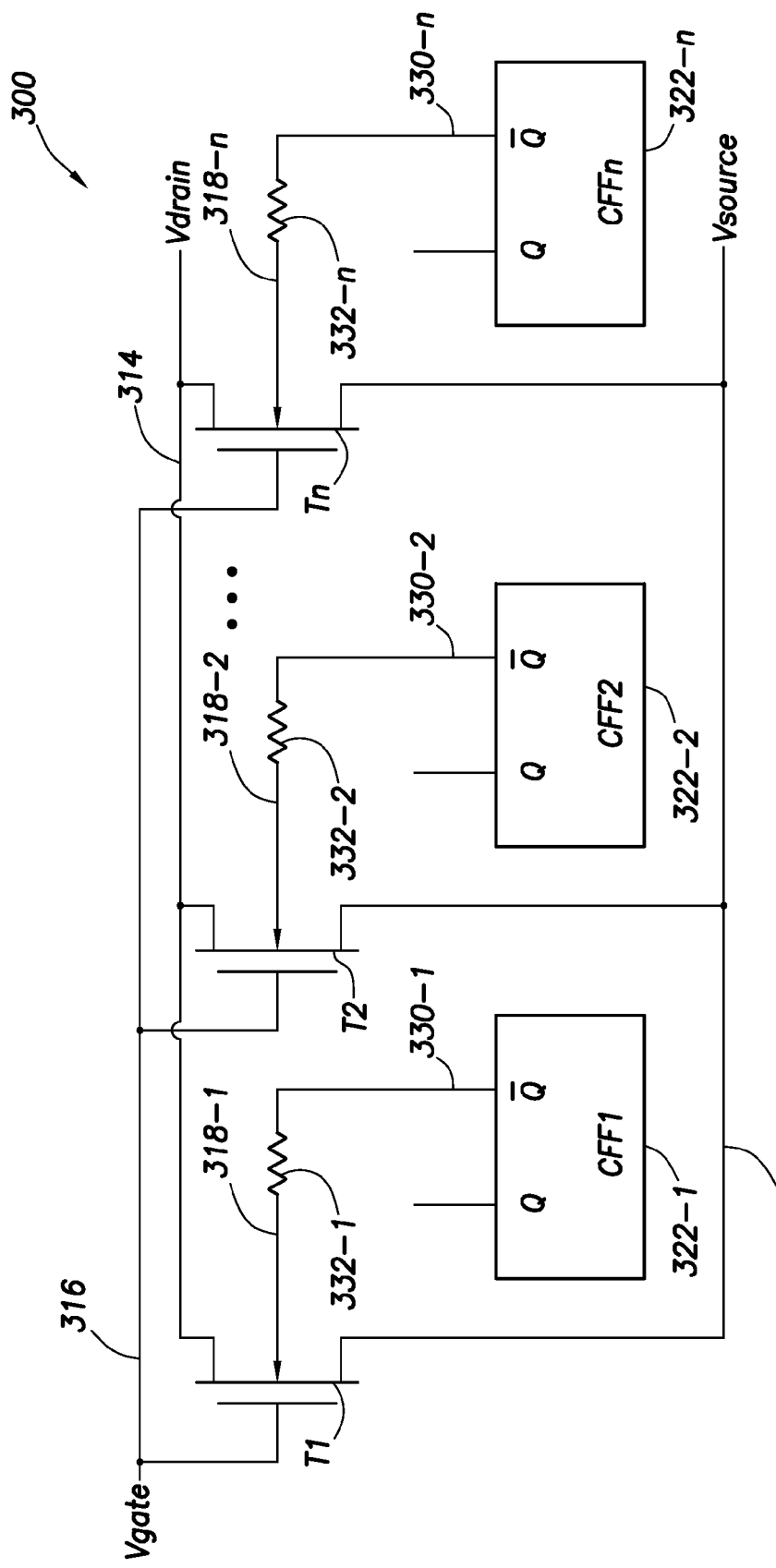
FIG. 3 is a circuit diagram for a digitally controlled mixed-signal transistor device according to a further embodiment of the invention.

FIG. 3 is a circuit diagram for an n-state digitally controlled mixed-signal transistor device 300 according to a further embodiment of the invention. The transistor device 300 is divided into transistor segments T1 to Tn, with each segment having individually controlled body bias. The source region of each transistor segment is coupled to a Vsource bus 312, and the drain regions are coupled to a Vdrain bus 314. The gates of the transistor segments are coupled to a Vgate bus 316. Each of the transistor segments has an independent body tie bias terminal 318-1 to 318-n that is connected to a respective n-control flip-flop 322-1 to 322-n using a single control line 330-1 to 330-n and resistors 332-1 to 332-n, without any interface transistors.

The configuration of transistor device 300 is useful when voltages V1 and V2 can be Vss (negative supply voltage) and Vdd, respectively. The body tie of each transistor segment can then be connected directly to the flip-flop through the resistor, creating minimum area impact.

Depending upon the specific use of the transistor devices in FIGS. 2 and 3 in a circuit, various combinations of transistors, diodes, and resistive elements can be employed to engineer the exact effects of the control flip-flops on the transistor segments.

PLL Implementation

Figure 4:
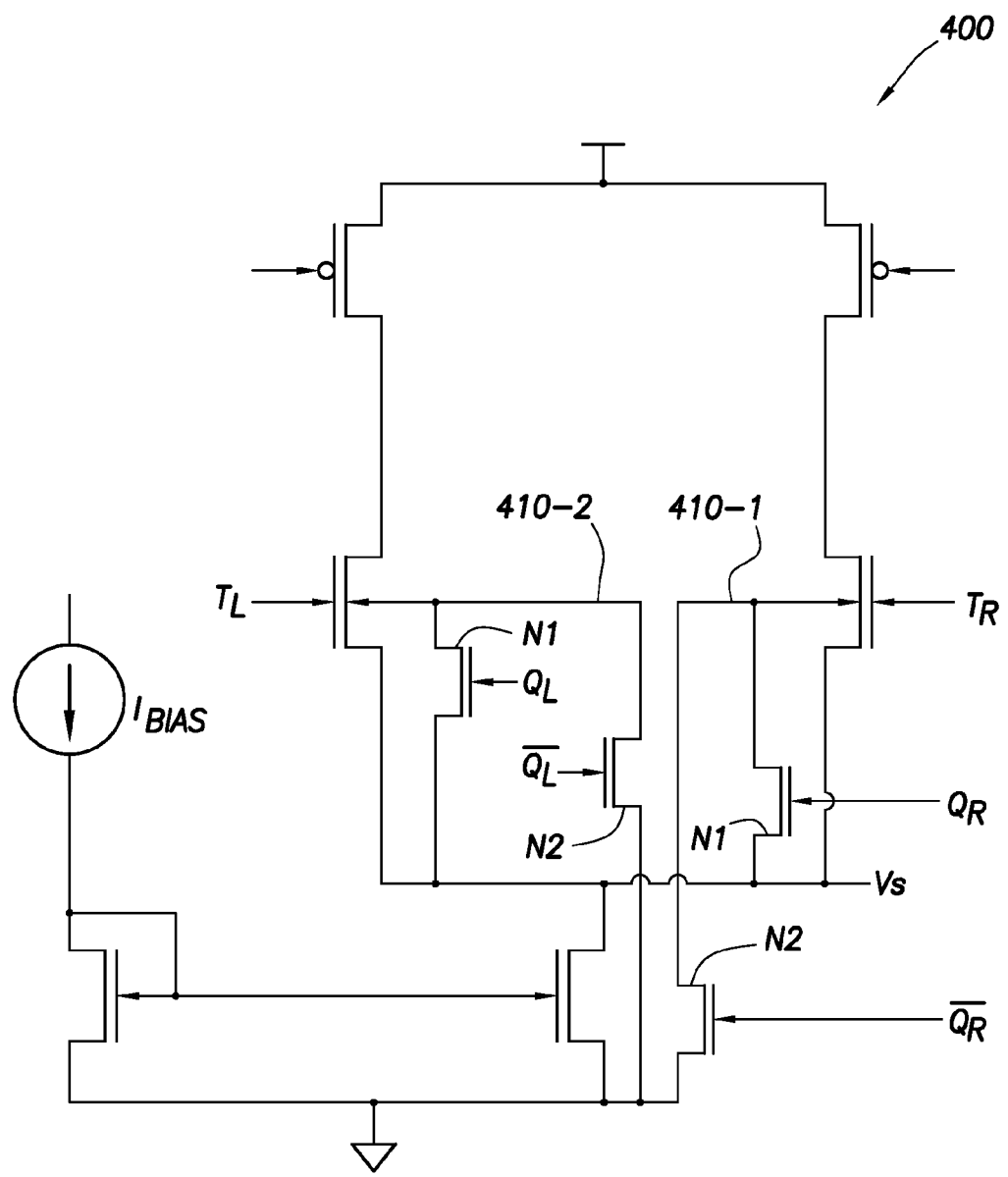
FIG. 4 is a circuit diagram for a mixed-signal circuit in the form of a voltage controlled oscillator used in a phase locked loop circuit according to one approach of the present invention.

FIG. 4 is a circuit diagram for a mixed-signal circuit 400 in the form of a voltage controlled oscillator (VCO) circuit used in a phase locked loop (PLL) that has been modified according to the technique of the present invention. In such mixed-signal circuits, alternate options for the bias voltages V1 and V2 are already available and require no additional power generating circuitry. The circuit 400 includes a differential pair of transistors $T_R$ and $T_L$. A body tie terminal 410-1, 410-2 for each of the transistors can be connected either to a source or ground.

For a typical 1.8 V circuit design, the difference between the source voltage of the differential pair of transistors and ground is about 0.3 V, which will adjust the threshold voltage (Vt) by about 40-50 mV. The ability to eliminate about 40-50 mV of Vt mismatch enables the use of minimum gate length transistors and reduces the required gate area considerably.

The ability to adjust Vt by a 40 mV increment enables a single flip-flop for each transistor to achieve +/−20 mV matching. For circuit designs where matching to better than 20 mV is needed, the transistors $T_R$ and $T_L$ in FIG. 4 can be divided up into n segments as described above with respect to FIG. 1. Dividing the transistors into two segments equal in width improves the matching capability by a factor of 2. Further, dividing one of the two segments by a factor of 2 improves the matching capability by another factor of 2. Each division requires an additional flip-flop to control the new segment of the transistor.

As shown in FIG. 4, for example, each of body tie terminals 410-1 and 410-2 for transistors $T_R$ and $T_L$ are connected to Vs through a pair of interface transistors N1, N2. Each of the interface transistors N1, N2 are coupled to outputs $Q_L$ and $Q_R$ of a digital latch or flip-flop, which determine to which voltage node the bodies of the differential pair of transistors $T_R$ and $T_L$ are connected.

Thus, a simple relationship exists between the required matching specifications and the number of control bits required. However, there is no significant speed and power penalty involved in this division of the critical transistors into n segments because the additional parasitic capacitance involved is small. In fact, for a given required matching precision, the present approach will always yield the best speed/power ratio because use of standard methods only improves matching in proportion to the square of the transistor gate area, reducing speed and increasing power in a similar fashion.

An analysis of a PLL implementation using the present approach suggested that a 15-30% reduction in mixed-signal circuit transistor area, even with the additional minimum sized interface switch transistors, can be realized with a 40-80% reduction in the gate area of the high speed circuitry, reducing AC power or increasing maximum speed. The area consumed by adding back in the local storage flip-flops and the control circuitry is a function of the speed, sophistication, and number of control interface nodes desired, but a reasonable estimate would be somewhere between no net growth and doubling the total transistor area which is less than about 10% of the total PLL area.

System Implementation and Operation

In an exemplary system implementation, the foregoing digitally controlled transistors at mixed-signal circuit nodes can be programmed dynamically during operation with a system level or local control engine integrated into the circuit, to account for changes in environment or speed/power requirements. For example, in one embodiment a digital controller can be connected to the flip-flops. Such a configuration is shown in FIG. 1, where a controller 130 can be interfaced with control flip-flops 122-1 to 122-n. The controller can be integrated on-chip with the mixed-signal circuits, or can be off-chip. The flip-flops can be connected in a serial scan mode to be loaded by the controller.

The controller can be implemented using software, firmware, hardware, or any appropriate combination thereof, as known to one of skill in the art. By way of example, the hardware components can include one or more microprocessors, memory elements, digital signal processing (DSP) elements, interface cards, and other standard components known in the art. Any of the foregoing may be supplemented by, or incorporated in, one or more specially-designed application-specific integrated circuits (ASICs) or field programmable gate arrays (FPGAs).

The controller operates to adjust the mixed-signal circuit functionality to compensate for process and mismatch induced variation effects. This enables the system to "heal" itself, improving yield and performance because the mixed-signal circuit transistors need not be oversized to allow for the full normal process variation window. By adding the capability for the controller to be able to monitor the mixed-signal circuit functionality and ambient temperature, a feedback loop can be created that enables the system to maintain itself within a narrower window of operation than would be possible in a standard circuit design.

In order to perform real time modifications to the circuit to adjust for changes in temperature or radiation, simple latches can be placed between the serial flip-flops and the interface transistors. This prevents the interface transistors from changing state as the information is scanned through the serial flip-flops to the desired location. A global control transfer signal that moves the data from the flip-flops to the latches can be used to implement the changes simultaneously to the new state without going through any intermediate non-functional states. In this configuration, the circuit would continue to function within specification at all times. Thus, incremental changes in temperature and radiation sensor information monitored by the system controller can be used to modify the circuit response on a real time basis similar to what a more complicated analog/mixed-signal circuit design might do to compensate for temperature effects.

At the system level for a PLL implementation, ring oscillator structures can be implemented to enable on-chip analysis of critical die level parametrics such as gate and MIM (metal-insulator-metal) capacitance, threshold voltage, and transistor drive strength including body tie bias effects. These structures can be interrogated by a chip control system to enable chip control algorithms to adjust for nominal die-to-die level process and ambient temperature and radiation during the healing procedure.

The post processing ability to digitally adjust critical node device characteristics in mixed-signal circuits results in a reduction in transistor gate area, improving power and performance metrics as well as yield.

If it is desired to only improve mixed-signal circuit yield, the state of the flip-flops or the control interface transistor gate voltages can be permanently programmed during initial testing using standard laser repair techniques. For example, laser fuses can be employed for one time programmability at initial device testing similar to static random access memory (SRAM) yield enhancement techniques. This eliminates all the chip area overhead required for the circuit sensing and control circuitry if they are not needed for real time adjustment in the field during normal operation.

Circuit Testing and Modeling

Figure 5A:
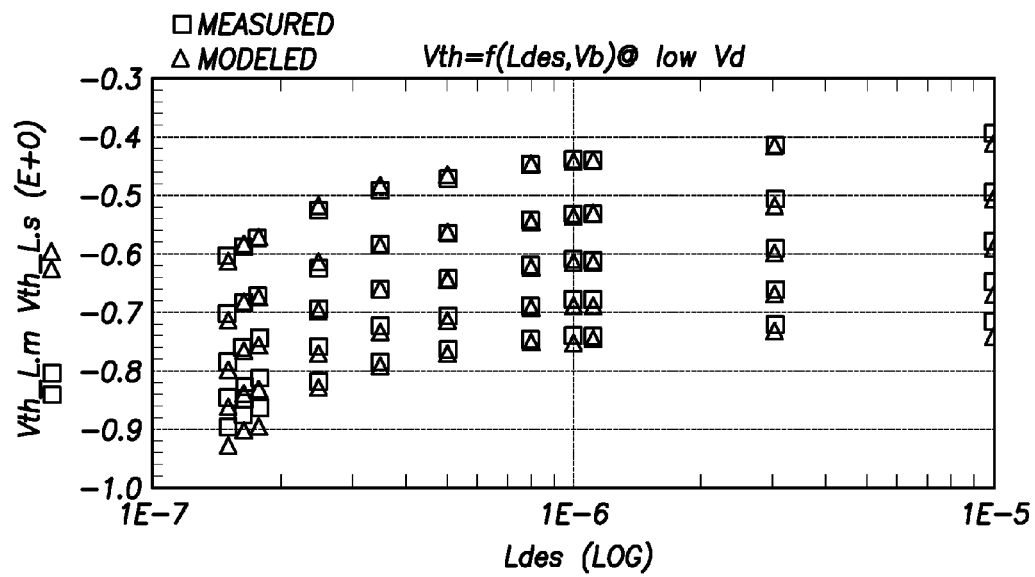
FIGS. 5A and 5B are plots of a comparison of measured and modeled transistor mismatch characteristics as a function of device length when different bias voltages are applied to a body tie terminal.
Figure 5B:
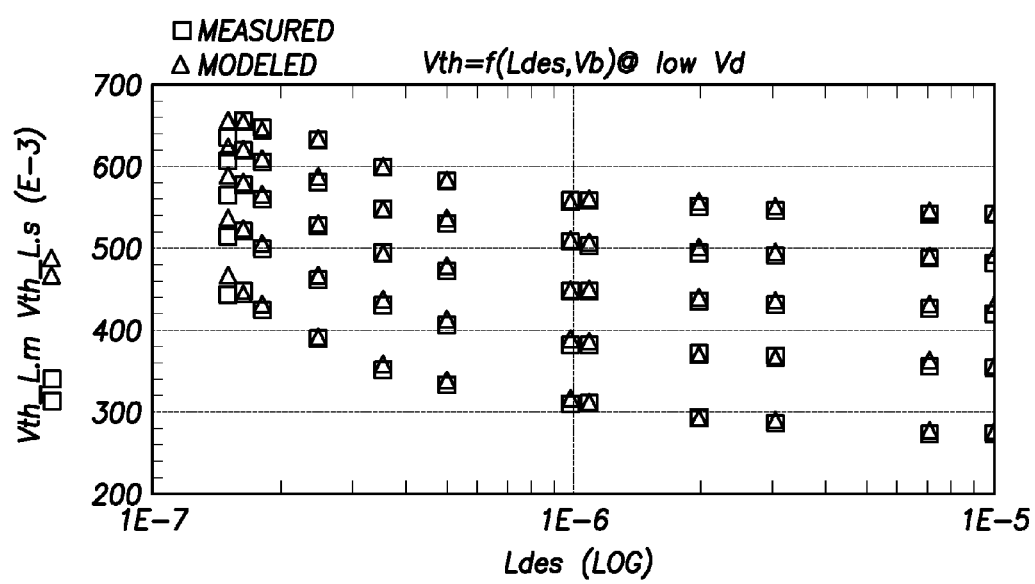

FIGS. 5A and 5B are plots of a comparison of measured and SPICE (Simulation Program with Integrated Circuit Emphasis) modeled transistor threshold voltage as a function of gate length (Ldes) when different bias voltages are applied to the body tie terminal (Vbody). In particular, FIG. 5A shows a plot of P-channel linear Vt vs Ldes at Vbody=0 to 1.8 V (including 0, 0.45, 0.9, 1.35, and 1.8 V). FIG. 5B depicts a plot of N-channel linear Vt vs Ldes at Vbody=0 to −1.8 V (including 0, −0.45, −0.9, −1.35, and −1.8 V).

FIGS. 5A and 5B demonstrate the ability to vary the device threshold by greater than 200 mV by adjusting the bias applied to the body tie terminal. This was accurately modeled in the SPICE models, permitting the standard circuit design environment to simulate the numerous design options for interfacing the mixed-signal circuit with the digital control logic at critical circuit nodes. Small minimum size transistors switched by digital control logic can be used to connect the body tie terminal of critical node transistors to different voltage nodes in the circuit to compensate for systematic and random variation in the transistors to target the circuit performance requirements.

Instructions for carrying out the various process tasks, calculations, and generation of signals and other data used in the operation of the system and method of the invention can be implemented in software, firmware, or other computer readable instructions. These instructions are typically stored on any appropriate computer readable medium used for storage of computer readable instructions or data structures. Such computer readable media can be any available media that can be accessed by a general purpose or special purpose computer or processor, or any programmable logic device.

Suitable computer readable media may comprise, for example, non-volatile memory devices including semiconductor memory devices such as EPROM, EEPROM, or flash memory devices; magnetic disks such as internal hard disks or removable disks; magneto-optical disks; CDs, DVDs, or other optical storage disks; nonvolatile ROM, RAM, and other like media; or any other media that can be used to carry or store desired program code means in the form of computer executable instructions or data structures. When information is transferred or provided over a network or another communications connection (either hardwired, wireless, or a combination of hardwired or wireless) to a computer, the computer properly views the connection as a computer readable medium. Thus, any such connection is properly termed a computer readable medium. Combinations of the above are also included within the scope of computer readable media.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A method for digital programmable optimization of a mixed-signal circuit, the method comprising:
   dividing up one or more transistor devices of the mixed-signal circuit into a plurality of transistor segments, with each transistor segment including a body tie bias terminal, and with each transistor segment coupled directly to a same voltage source bus, a same voltage drain bus, and a same voltage gate bus;
   coupling a first body tie bias terminal of a first transistor segment to a first voltage bias by:
      coupling the first body tie bias terminal in signal communication with a first bias node in the mixed-signal circuit; or
      coupling the first body tie bias terminal in signal communication with a first non-precision bias voltage source in the mixed-signal circuit;
   coupling a second body tie bias terminal of a second transistor segment to a second, different voltage bias by:
      coupling the second body tie bias terminal in signal communication with a second, different bias node that is different from the first bias node in the mixed-signal circuit; or
      coupling the second body tie bias terminal in signal communication with a second, different non-precision bias voltage source that is different from the first non-precision bias voltage source in the mixed-signal circuit; and
   arranging each body tie bias terminal to be coupled to a separate one of one or more digital programmable storage elements.

2. The method of claim 1, wherein each body tie terminal is coupled with a separate digital programmable storage element through a pair of interface transistors controlled by the digital programmable storage element.

3. The method of claim 2, wherein each of the interface transistors in the pair is coupled to separate outputs of the digital programmable storage element.

4. The method of claim 2, wherein the pair of interface transistors is coupled to a single output of the digital programmable storage element.

5. The method of claim 4, wherein the digital programmable storage element is configured for one-time programming.

6. The method of claim 1, further comprising interfacing each of the digital programmable storage elements with a real time central controller.

7. The method of claim 6, wherein the real time central controller is integrated on-chip with the mixed-signal circuit.

8. The method of claim 1, wherein the first non-precision bias voltage source and the second, different non-precision bias voltage source are provided by at least one output of the one or more digital programmable storage elements.

9. The method of claim 1, further comprising implementing the mixed-signal circuit in a phase locked loop circuit.

10. A digitally programmable mixed-signal circuit, comprising:
   a transistor device comprising a plurality of transistor segments, which each transistor segment including a body tie bias terminal, and with each of the transistor segments coupled directly to a same voltage source bus, a same voltage drain bus, and a same voltage gate bus;
   a first body tie bias terminal of a first transistor segment coupled to a first voltage bias, the first voltage bias comprising:
      a first bias voltage from one or more of a first bias nodes in the mixed-signal circuit; or a first non-precision bias voltage generated with a first non-precision bias voltage source in the mixed-signal circuit;

a second body tie bias terminal of a second transistor segment coupled to a second, different voltage bias, the second, different voltage bias comprising:

a second, different bias voltage from one or more of a second, different bias nodes that are different from the one or more of the first bias nodes in the mixed-signal circuit; or a second, different non-precision bias voltage generated with a second, different non-precision bias voltage source that is different than the first non-precision bias voltage source in the mixed-signal circuit; and one or more digital programmable storage elements each coupled to a separate one of the one or more body tie bias terminals.

11. The mixed-signal circuit of claim 10, further comprising one or more pairs of interface transistors interposed between and coupled to each of the body tie bias terminals and each of the digital programmable storage elements, wherein each of the pairs of interface transistors are controlled by a respective digital programmable storage element.

12. The mixed-signal circuit of claim 11, wherein each of the interface transistors in a pair is coupled to separate outputs of the respective digital programmable storage element.

13. The mixed-signal circuit of claim 11, wherein each pair of interface transistors is coupled to a single output of the respective digital programmable storage element.

14. The mixed-signal circuit of claim 13, wherein each digital programmable storage element is configured for one-time programming.

15. The mixed-signal circuit of claim 10, further comprising a real time central controller operatively coupled to the one or more digital programmable storage elements.

16. The mixed-signal circuit of claim 15, wherein the real time central controller is on-chip with the mixed-signal circuit.

17. The mixed-signal circuit of claim 10, wherein the digital programmable storage elements comprise digital flip-flops.

18. The mixed-signal circuit of claim 10, wherein the first non-precision bias voltage and the second non-precision bias voltage are generated by at least one output of the one or more digital programmable storage elements.

19. The mixed-signal circuit of claim 10, wherein the mixed-signal circuit is an analog circuit or a digital circuit.

20. The mixed-signal circuit of claim 10, wherein the mixed-signal circuit is part of a phase locked loop circuit.

* * * * *